(12) United States Patent
Hacker et al.

(10) Patent No.: US 10,131,007 B2
(45) Date of Patent: Nov. 20, 2018

(54) CUTTING TOOL AND METHOD FOR ITS MANUFACTURE

(71) Applicant: Kennametal Inc., Latrobe, PA (US)

(72) Inventors: Michael Hacker, Nürnberg (DE); Marcus Paul, Nuremberg (DE); Karl Wendt, Ebermannstadt (DE)

(73) Assignee: KENNAMETAL INC., Latrobe, PA (US)

( * ) Notice: Subject to any disclaimer, the term of this patent is extended or adjusted under 35 U.S.C. 154(b) by 57 days.

(21) Appl. No.: 15/349,094

(22) Filed: Nov. 11, 2016

(65) Prior Publication Data

US 2017/0136562 A1 May 18, 2017

(30) Foreign Application Priority Data

Nov. 13, 2015 (DE) .................. 10 2015 222 491

(51) Int. Cl.
| | | |
|---|---|---|
| *B23D 77/00* | (2006.01) | |
| *B23P 15/46* | (2006.01) | |
| *B24B 3/60* | (2006.01) | |
| *C23C 14/06* | (2006.01) | |
| *C23C 14/24* | (2006.01) | |

(52) U.S. Cl.
CPC .............. *B23D 77/00* (2013.01); *B23P 15/46* (2013.01); *B24B 3/60* (2013.01); *C23C 14/0641* (2013.01); *C23C 14/24* (2013.01); *B23D 2277/2414* (2013.01)

(58) Field of Classification Search
CPC ............ B23B 2224/24; B23B 2224/28; B23B 2224/32; B23B 2224/36; B23C 2224/24; B23C 2224/28; B23C 2224/32; B23C 2224/36; B23D 77/00; B23D 2277/24; B23D 2277/2407; B23D 2277/2414; B23D 2277/2485; B23D 2277/2492; B23P 15/46

See application file for complete search history.

(56) References Cited

U.S. PATENT DOCUMENTS

| | | | | |
|---|---|---|---|---|
| 4,008,976 A | * | 2/1977 | Holzl ................... | B21D 37/205 407/119 |
| 4,583,888 A | * | 4/1986 | Mori ...................... | B23B 51/02 408/144 |

(Continued)

FOREIGN PATENT DOCUMENTS

| | | |
|---|---|---|
| DE | 19742765 A1 | 4/1999 |
| DE | 19859905 C2 | 5/2002 |

(Continued)

OTHER PUBLICATIONS

Jun. 24, 2016 First office action P15-06089-DE-NP.

*Primary Examiner* — Daniel Howell
(74) *Attorney, Agent, or Firm* — Ian K. Samways

(57) ABSTRACT

A cutting tool (2) is specified with a cutting region (4) that comprises a substrate (12) onto which a coating (10) is applied, which coating (10) is subsequently processed, whereby a sharp cutting edge (8) is formed. Furthermore, a corresponding method for the manufacture of the cutting tool (2) is specified. By means of the sharpening of the cutting edge (8) after the coating rather than before, a particularly sharp cutting edge (8) is formed, whereby the precision of the cutting tool (2) as well as its service life is improved.

17 Claims, 1 Drawing Sheet

(56) References Cited

U.S. PATENT DOCUMENTS

| | | | | |
|---|---|---|---|---|
| 4,704,055 A | * | 11/1987 | Guhring | B22F 5/10 |
| | | | | 408/144 |
| 4,744,705 A | * | 5/1988 | Imanaga | B23B 51/02 |
| | | | | 408/145 |
| 5,137,398 A | * | 8/1992 | Omori | B23B 51/048 |
| | | | | 175/420.2 |
| 5,431,072 A | * | 7/1995 | Christoffel | B23P 15/30 |
| | | | | 407/119 |
| 6,402,438 B1 | * | 6/2002 | Boyer | B23B 51/00 |
| | | | | 407/118 |
| 6,517,688 B2 | * | 2/2003 | Sakurai | C23C 16/27 |
| | | | | 204/192.32 |
| 6,655,882 B2 | * | 12/2003 | Heinrich | C22C 29/005 |
| | | | | 407/119 |
| 7,241,088 B2 | * | 7/2007 | Malagnino | B23G 5/06 |
| | | | | 408/144 |
| 2014/0169896 A1 | | 6/2014 | Kunschir | |

FOREIGN PATENT DOCUMENTS

| | | |
|---|---|---|
| DE | 102010038077 A1 | 4/2012 |
| WO | WO2014127105 A2 | 8/2014 |
| WO | WO2014197000 A1 | 12/2014 |

\* cited by examiner

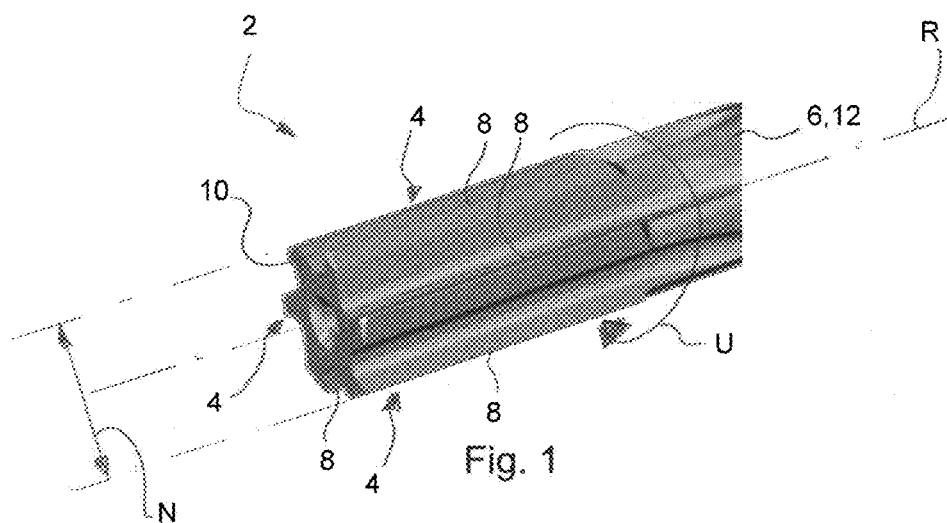
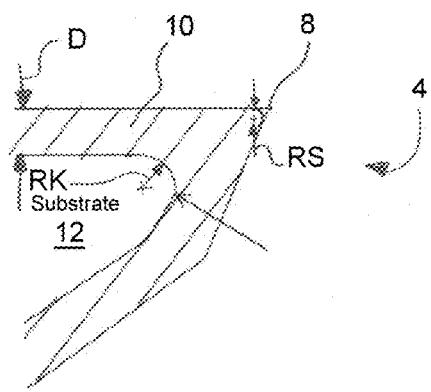

CUTTING TOOL AND METHOD FOR ITS MANUFACTURE

RELATED APPLICATIONS

This application claims priority to German Patent Application No. 102015222491 filed Nov. 13, 2015, the contents of which are incorporated herein by reference in its entirety.

FIELD OF THE INVENTION

The invention relates to a cutting tool and a method for its manufacture.

BACKGROUND

A cutting tool generally serves for machining a workpiece from which material is removed in chips. For this purpose, the cutting tool comprises a number of cutting edges that engage the material. The chips produced are then typically transported away via a flute.

When the workpiece is machined, the cutting edge is abraded and the cutting tool is worn down in the region of the cutting edge. In order to improve the stability of the cutting edge, its cutting properties, and the service life of the cutting tool, it is basically possible to additionally coat them, i.e. to form a cutting edge with a coating made of a hard material. With such hard material coatings, there is however the problem that the susceptibility to cracking increases with increasing layer thickness, in particular in the region of the sharp cutting edge. Oftentimes, only limited layer thicknesses can therefore be applied. Higher layer thicknesses in the region of the cutting edge also result in undesired round edges, since the material (that is typically applied using the PVD or CVD method) is increasingly deposited on the edge. In particular in the region of the cutting edge, there is therefore also the risk of micro-cracks in the coating and it chipping off of the base substrate.

Reaming tools, also called reamers, are typically used as finishing tools to produce boreholes with high precision or to finely machine them. Reaming tools of this type can be learned from WO 2014 197000 A, WO 2014 127105 A, or U.S. Pat. No. 2,014,169 896 A, for example. Such reaming tools comprise at their periphery at least one, typically several (reaming) cutting edges distributed on their periphery. A precise adjustment of the radial position of the cutting edges is thereby essential in finishing tools.

SUMMARY OF THE INVENTION

A task of the invention is to specify an improved cutting tool, in particular a finishing tool, with a longer service life, and a method for the manufacture of such a cutting tool.

The task is achieved according to the present invention by a cutting tool having the features according to claim 1, as well as by a method having the features according to claim 11. Advantageous embodiments, refinements and variants are the subject matter of the dependent claims. In this respect, the embodiments and advantages in connection with the cutting tool also apply accordingly to the method, and vice versa.

The cutting tool serves to machine a workpiece and comprises a cutting region that comprises a substrate, onto which a coating is applied, which is subsequently processed, whereby a sharp cutting edge is formed. In this case, the cutting edge is a cutting edge that engages the workpiece during operation and removes chips from it. The substrate is in particular a base body of the cutting tool or a base body of a cutting insert for an assembled or modular cutting tool.

In order to manufacture the cutting tool, a (hard material) coating is applied in a cutting region onto a substrate for the cutting tool, which coating is subsequently processed by sharpening the coating such that a sharp cutting edge is formed. In doing so, the substrate itself in particular already has a cutting edge or a raw cutting edge that is then coated with the coating and subsequently formed as a sharp cutting edge by sharpening within the scope of a subsequent processing.

A significant advantage of the invention exists in particular in that the cutting edge, i.e. a sharp contour, is not formed until after the coating and that, as a consequence, the formation of a cutting edge is independent of the coating process. This advantageously makes it possible to form a cutting edge that is sharper than that in a traditional manufacturing process. In particular, the quality of the cutting edge, i.e. its sharpness, is advantageously independent of the underlying shape of the substrate, since the sharpening—and thus the definition of the cutting edge—only occurs subsequently. This in particular also ensures a precise adjustment of the radial position of the cutting edge.

This is based on the knowledge that the coating is generally applied approximately uniformly, and therefore substantially follows the outer contour of the substrate. For this reason, with conventional tools the substrate is appropriately prepared and pre-ground or pre-sharpened in order to still subsequently obtain a sufficiently sharp cutting edge even after the coating. According to the present invention, such a preceding sharpening of the substrate is preferably dispensed with at least to such a degree that no full sharpening takes place. Expediently, however, the substrate is pre-sharpened prior to the coating in order to subsequently achieve an improved precision in the coating and positioning of the cutting edge so that in particular the desired final contour, i.e. in particular the sharp cutting edge, is also reliably recovered in the coating, which generally cannot be formed with any thickness. According to the present invention, the cutting edge is thus formed only or at least predominantly via a finishing sharpening step and directly on the coating. A considerably better sharpness and quality of the cutting edge is thereby achieved than by the preceding sharpening and subsequent coating. The cutting tool manufactured accordingly is clearly manufactured more precisely and also has an improved service life as a result of the improved cutting edge.

Another advantage of the invention exists in particular in that the cutting tool is manufactured with an improved tolerance. This in particular means that the cutting tool has a nominal diameter with a tolerance, and that the coating has a layer thickness, wherein the tolerance is independent of the layer thickness. Generally, the tolerances in the sharpening of the substrate and the application of the coating are added together in the manufacturing. According to the present invention, however, the subsequent processing of the coating by sharpening of the same constitutes an in particular final method step, at least with respect to the design of the outer contour of the cutting tool, so that the tolerance of the nominal diameter is advantageously only determined by the subsequent processing, i.e. the formation of the sharp cutting edge.

In addition, greater layer thicknesses can thereby also be achieved, since the undesired round edge at the cutting edge, which is traditionally associated with greater layer thicknesses, is precisely avoided. Furthermore, the layer thickness tolerance in particular increases with the layer thickness itself, i.e. tools with thicker layers have a less precise diameter. By means of the subsequent machining, such inaccuracies are also advantageously reduced. This also reduces the risk of micro-cracks in the region of the cutting edge, which also allows greater layer thicknesses and thus a longer service life.

In a preferred embodiment, the cutting tool is manufactured with a nominal diameter by providing the substrate initially with a substrate diameter that is less than the nominal diameter. The nominal diameter is subsequently adjusted by reducing the coating, in particular by partially grinding it off, in the cutting region after the substrate is coated. The coating is thus reduced by removal or reduction in particular in the radial direction, such that the cutting tool has a specified and desired nominal diameter. By means of the subsequent reduction, the cutting tool is manufactured particularly precisely and has an accordingly improved tolerance.

As a result of the improved tolerance and the increased precision in the manufacturing in general, the cutting tool is in particular suitable for the final machining of a workpiece, i.e. for treating its surface, for example, during what is known as finishing. In a preferred embodiment, the cutting tool is therefore designed as a finishing tool and in particular as a reamer. The reamer generally comprises a base body with a number of cutting edges that are arranged distributed in particular in the peripheral direction around the base body. A reamer serves primarily for the final machining of boreholes or inner surfaces. The cutting edges therefore generally extend in the longitudinal direction along the base body and up to the end surface, where often times a chamfer or a cutting corner is respectively also arranged in order to ensure a defined transition from the lateral region to the end region.

BRIEF DESCRIPTION OF THE DRAWINGS

An exemplary embodiment of the invention is explained in detail below in reference to the drawing. Shown diagrammatically in particular are:

FIG. 1 illustrates a cutting tool designed as a reamer in a perspective view, and FIG. 2 illustrates a cutting region of the reamer in a cross-sectional view.

DETAILED DESCRIPTION

Generally, the cutting tool comprises a base body or support, on which the cutting region is arranged or formed. In a first variant, the cutting tool is designed as one piece and the base body constitutes the substrate for coating. Prior to coating, cutting regions are then typically ground, for example, into this base body. In a second variant, one or more cutting regions are secured, e.g. soldered or adhesively bonded, on a base body, or alternatively they are secured on a support so as to be removable, as cutting inserts or cutting plates within the meaning of a modular tool. The cutting regions are then coated before or after the mounting on the support or base body and sharpened before or after the mounting.

The cutting region is thus that part of the cutting tool in which the cutting edge is formed. In doing so, the cutting tool can also comprise several cutting regions in which at least one cutting edge is respectively arranged.

The substrate generally comprises an edge, in particular a raw cutting edge, that has an edge radius and that is covered by the coating for the formation of the cutting edge, wherein the cutting edge has a cutting edge radius that—in a preferred embodiment—is smaller than the edge radius. In other words: the cutting edge is sharper than the substrate; more precisely, it is sharper than the edge or raw cutting edge. If the coating is not processed subsequently, the cutting edge radius results from the addition of the edge radius and the layer thickness of the coating. Since the cutting edge radius is in principle larger after the coating than the edge radius on which the coating is formed, the reduction of the cutting edge radius is in particular realized by the subsequent processing. The coating is thus sharpened such that the cutting edge radius is smaller than the edge radius. This is based on the consideration that an edge radius as large as possible ensures an improved adhesion of the coating, and that thereby in particular the risk of the formation of micro-cracks in the coating and the risk of the coating chipping off are also reduced. In traditionally manufactured tools, however, a larger edge radius has a disadvantageous effect on the cutting edge radius. However, since the cutting edge radius is now determined by the subsequent processing, it is now independent of the edge radius so that this edge radius is advantageously primarily selected from the point of view of an optimal adhesion of the coating to the substrate.

In order to ensure a particularly good adhesion, the edge is preferably rounded. For this purpose, prior to the coating the edge is in particular additionally rounded, e.g. ground, brushed, or blasted, and the edge radius is generally enlarged.

In a particularly preferred embodiment, the edge radius is between 5 and 20 μm, whereby a suitable adhesion is ensured for typical coatings.

The cutting edge preferably has a cutting edge radius in the range of 1 to 5 μm and is in particular thereby formed as a sharp cutting edge. In other words: "sharp" in particular refers to a cutting edge radius in the range of 1 to 5 μm. The preferred range can, however, deviate depending on the intended use of the cutting tool and depending on the material of a workpiece to be machined. A cutting edge radius of 1 to 5 μm is in particular suitable for ductile materials and in general for long-chipping materials, and is therefore also preferably selected for cutting tools for machining such materials.

Preferably, the coating has a layer thickness that is larger than the edge radius. As a result, the coating is in particular formed as a sufficiently thick layer with good stability.

In a suitable embodiment, the coating has a layer thickness of at least 5 μm. In another, particularly suitable embodiment, the coating has a layer thickness of at least 10 μm. In this respect, the layer thickness preferably ranges to 15 μm or even to 20 μm.

The layer thickness is generally not measured in proximity to the cutting edge but preferably in a section, in which the substrate extends substantially linearly. In the region of the cutting edge, the coating then regularly has a greater layer thickness. This is in particular determined by the subsequent processing, i.e. by the subsequent sharpening to form the cutting edge. Namely, in doing so, a portion of the coating is removed and thereby reduced starting from an original layer thickness. For the sharpening, a more significant removal takes place outside the cutting edge in order to reduce the cutting edge radius and to obtain an accordingly sharper cutting edge. When manufacturing the cutting tool, a somewhat thicker layer thickness is thus applied in principle, which is then reduced in segments in order to obtain the desired nominal diameter, in particular the reamer diameter, and to sharpen the cutting edge. In particular, the layer thickness is just great enough to realize a longer service life.

However, the primary goal is in particular the mentioned and particularly small tolerance of the nominal diameter.

The coating is in particular designed as a multi-layer coating, i.e. it is applied in multiple layers so that an accordingly thick coating is formed in several stages and from several comparatively thin partial coatings. In this way, in particular the desired layer thickness can be realized by traditional coating methods by performing them multiple times, for example two to five times.

Preferably, the coating is applied by means of a deposition method, in particular by means of PVD, i.e. physical vapor deposition. In particular, the aforementioned layer thicknesses can thereby be realized. Such a deposition method produces the coating in particular atom by atom or molecule by molecule, has a particularly high precision, and ensures an initially particularly homogeneous coating. In principle, CVD—i.e. chemical vapor deposition—can also be used as deposition method instead of PVD.

In particular, the coating has a layer thickness of at most 20 μm. Greater layer thicknesses generally result in a reduced stability of the coating, and during operation there is then the risk of a chipping off or a detaching of portions of the coating. In this respect, a limitation to at most 20 μm offers an optimal compromise between a layer thickness that is as thick as possible and at the same time a coating that is as stable as possible.

The coating is preferably harder than the substrate and consists in particular of a ceramic. The coating is preferably a titanium-based coating or a metal nitride coating, such as titanium nitride or aluminum chromium nitride. A hard coating of this type ensures an improved service life.

The substrate preferably consists of carbide or cermet. Particularly important is a good adhesion of the coating, i.e. the materials of the substrate and the coating are expediently coordinated in order to ensure a stable adhesion to one another.

In the manufacture of the cutting tool, in a preferred embodiment the coating is sharpened by means of a laser. Such a sharpening is characterized by a high precision and is therefore in particular suitable for the manufacture of cutting tools for finishing, such as reamers. A laser machining also makes possible a particularly detailed embodiment of the cutting edge, as well as an embodiment depending on the application of the cutting tool.

In a suitable alternative, the coating is sharpened by means of a grinding process. For example, a grinding wheel is used for this purpose.

FIG. 1 shows in sections and in a perspective view a cutting tool 2 that is designed as a reamer and comprises on its front side several (in this case six) cutting regions 4 that are arranged distributed in the peripheral direction U around a base body 6 of the cutting tool 2. In order to form cutting edges 8, a coating 10 is applied onto the base body 6. In the process, the base body 6 serves as a substrate 12 for the coating 10 in the exemplary embodiment shown. The cutting tool 2 shown here is additionally designed as one piece, i.e. the cutting regions 4 are fixed parts of the base body 6. In a variant not shown, the cutting regions 4 are secured on the base body as separate parts, i.e. they are soldered or secured so as to be removable, e.g. screwed in tightly as cutting plates.

During operation, the cutting tool 2 rotates about an axis of rotation R and is thus designed as a rotary tool. The cutting edges 8 then engage a workpiece (not shown). Between two cutting edges 8 respectively adjacent to one another in the peripheral direction U, a flute (not described in more detail) is respectively additionally formed here in order to transport away the chips produced during operation.

FIG. 2 shows one of the cutting regions 4 of FIG. 1 in section, in a cross-sectional view transversal to the axis of rotation R. On the one side the cutting edge 8 that is formed by the coating 10, and on the other side the substrate 12 onto which the coating 10 is applied, can be seen clearly. In addition, the specific design of the coating 10 as a sharp cutting edge 8 is particularly clear. This is achieved by a subsequent processing, more precisely a sharpening of the coating 10 after the application, preferably by machining with a laser, alternatively by means of a grinding process.

During application, the coating 10 initially follows the contour of the substrate 12 in the cutting region 4 and then has an accordingly large cutting edge radius RS. This cutting edge radius RS is typically somewhat larger than an edge radius RK of the substrate 12 in the cutting region 4. In order to realize a cutting edge 8 that is as sharp as possible, the substrate 12 is therefore traditionally initially sharpened in order to reduce the edge radius RK, and a coating 10 is subsequently applied. In comparison, in the cutting tool 2 shown here the substrate 12 is initially only pre-sharpened, then coated, and the coating 10 is then subsequently sharpened, i.e. the cutting edge radius RS is reduced instead of the edge radius RK. The unchanged large edge radius RK then contributes to an improved adhesion of the coating 10 to the substrate 12. The sharp cutting edge 8, by contrast, allows for precise cutting with the cutting tool 2, which additionally has an improved service life.

In FIG. 2, the edge radius RK is approximately 10 μm; by contrast, the cutting edge radius RS is comparatively sharp and amounts to approximately 3 μm in FIG. 2. The coating additionally has a layer thickness D, which is approximately 15 μm in FIG. 2. In the region of the cutting edge 8, the layer thickness D is greater. This results in particular from the subsequent machining. Namely, the coating 10 was initially formed to be thicker and then suitably reduced in order to obtain the shape according to FIG. 2 and to form the sharp cutting edge 8.

By means of this subsequent and partial removal of the coating 10, a defined, desired nominal diameter N of the cutting tool 2 is additionally adjusted as shown in FIG. 1. This means that the tolerance of the cutting tool 2 is only determined by the subsequent machining, and precisely not by the quality of the machining of the substrate 12 or the precision of the layer thickness D. By means of the subsequent sharpening, just enough of the coating 10 is removed so that the desired nominal diameter N is achieved. The tolerance is then only dependent on the quality of the subsequent processing.

The invention claimed is:

1. A cutting tool comprising:
   a cutting region comprising:
   a substrate defining at least two surfaces which come together to form an edge; and
   a coating applied to the substrate which covers at least a portion of each of the at least two surfaces and the edge of the substrate,
   wherein the coating is processed to provide a sharp cutting edge on the coating,
   wherein the edge of the substrate has an edge radius that is covered by the coating for the formation of the cutting edge on the coating, and
   wherein the cutting edge has a cutting edge radius that is smaller than the edge radius.

2. The cutting tool of claim 1, wherein the edge of the substrate is rounded.

3. The cutting tool of claim 1, wherein the edge radius is between 5 μm and 20 μm.

4. The cutting tool of claim 1, wherein the coating has a layer thickness that is greater than the edge radius.

5. The cutting tool of claim 1, wherein the cutting edge radius is in the range of 1 to 5 μm.

6. The cutting tool of claim 1, wherein the coating has a layer thickness of at least 5 μm.

7. The cutting tool of claim 1, wherein the coating has a layer thickness of at least 10 μm.

8. The cutting tool of claim 1, wherein the coating is harder than the substrate.

9. The cutting tool of claim 8, wherein the coating is a ceramic coating.

10. The cutting tool of claim 9, wherein the coating is a titanium-based coating or a metal nitrite coating.

11. The cutting tool of claim 1, wherein the cutting tool is a reamer having a base body and a number of cutting edges that are arranged in a peripheral direction around the base body.

12. A method of manufacturing a cutting tool comprising:
providing a substrate having a cutting region;
applying a coating to the cutting region of the substrate; and
subsequently processing the coating by sharpening to provide a sharp cutting edge on the coating,
wherein the substrate has an edge in the cutting region formed by two adjoining surfaces of the substrate, the method further comprising:
rounding the edge of the substrate prior to applying the coating to the substrate.

13. The method of claim 12, wherein:
the cutting tool has a nominal diameter;
the substrate has a substrate diameter less than the nominal diameter; and
the nominal diameter is formed by partially grinding the coating off of the substrate in the cutting region after applying the coating to the cutting region.

14. The method of claim 12, wherein processing the coating by sharpening is carried out by a laser.

15. The method of claim 12, wherein processing the coating by sharpening is carried out by a grinding process.

16. The method of claim 12, wherein the coating is applied by a deposition method.

17. The method of claim 16, wherein the coating is applied by PVD.

* * * * *